United States Patent [19]

Kusumoto et al.

[11] Patent Number: 4,849,260
[45] Date of Patent: Jul. 18, 1989

[54] METHOD FOR SELECTIVELY DEPOSITING METAL ON A SUBSTRATE

[75] Inventors: Yoshiro Kusumoto; Kazuo Takakuwa; Tetsuya Ikuta; Akitoshi Suzuki; Izumi Nakayama, all of Kanagawa, Japan

[73] Assignee: Nihon Sinku Gijutsu Kabushiki Kaisha, Japan

[21] Appl. No.: 68,910

[22] Filed: Jun. 30, 1987

[30] Foreign Application Priority Data

Jun. 30, 1986 [JP] Japan .................. 61-152922
Jul. 18, 1986 [JP] Japan .................. 61-170336
Jul. 19, 1986 [JP] Japan .................. 61-170281

[51] Int. Cl.⁴ .................. C23C 16/06; C23C 16/08
[52] U.S. Cl. .................. 427/250; 427/99; 427/251; 427/253; 427/255; 427/255.1; 427/255.7; 427/404; 427/419.2
[58] Field of Search .................. 427/250, 255.1, 253, 427/255, 99, 97, 237, 404, 251, 255.7, 419.1, 419.2, 419.7, 55, 255.5

[56] References Cited

U.S. PATENT DOCUMENTS

| | | | |
|---|---|---|---|
| 3,404,998 | 10/1968 | Pesetsky | 252/443 |
| 3,424,627 | 1/1969 | Michel et al. | 427/253 |
| 3,697,342 | 10/1972 | Cuomo | 427/255 |
| 3,697,343 | 10/1972 | Cuomo et al. | 427/250 |
| 3,794,516 | 2/1974 | Engeler et al. | 427/255 |
| 3,826,699 | 7/1974 | Sawazaki et al. | 427/250 |
| 3,900,646 | 8/1975 | Clyde | 427/251 |
| 4,191,794 | 3/1980 | Shirland et al. | 427/250 |
| 4,215,156 | 7/1980 | Dalal et al. | 427/250 |
| 4,349,408 | 9/1982 | Tarng et al. | 427/253 |
| 4,401,689 | 8/1983 | Ban | 427/255 |
| 4,404,235 | 9/1983 | Tarng et al. | 427/253 |
| 4,430,364 | 2/1984 | Ito | 427/253 |
| 4,435,445 | 3/1984 | Allred et al. | 427/54.1 |
| 4,469,045 | 9/1984 | Chesworthy | 427/255 |
| 4,504,526 | 3/1985 | Hofer et al. | 427/255 |
| 4,565,157 | 1/1986 | Brors et al. | 427/255.2 |
| 4,629,635 | 12/1986 | Brors | 427/255.2 |
| 4,650,698 | 3/1987 | Moriya et al. | 427/250 |

Primary Examiner—Sadie Childs
Attorney, Agent, or Firm—Jones, Day, Reavis & Pogue

[57] ABSTRACT

A wafer, in which at least one via hole is made in an insulating film formed on the substrate, is held on a wafer holder in a reaction chamber under reduced pressure, $WF_6$ gas is introduced into the reaction chamber so that a first metallic film of W is formed on the substrate in the via hole. The additional $WF_6$ gas and $H_2$ gas are introduced into the chamber and light from a heating lamp is directed onto the wafer such that a difference in temperature is created between the insulating film and the first metallic film such that a second metallic film of W is formed only on the first metallic film. The temperature difference is created because of the differences of the absorption ratios of infrared components of the light between the insulating film, the substrate and the first metallic film. The $WF_6$ gas and $H_2$ gas are made to flow in flat form substantially parallel to the surface of the wafer and an inert gas, such as Ar, is made to flow toward the surface of the wafer to control the flow of $WF_6$ and $H_2$.

20 Claims, 8 Drawing Sheets

Prior Art FIG.1
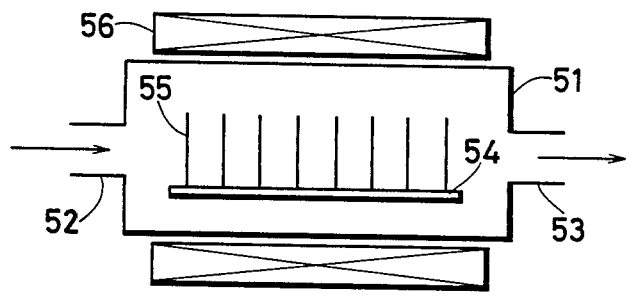
Prior Art FIG.2
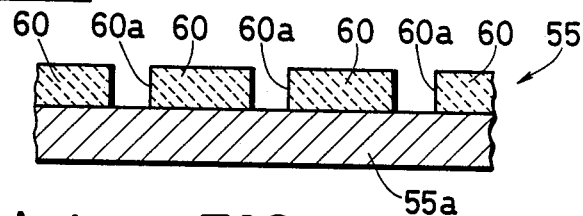
Prior Art FIG.3
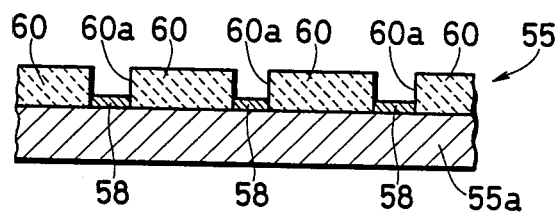
Prior Art FIG.4
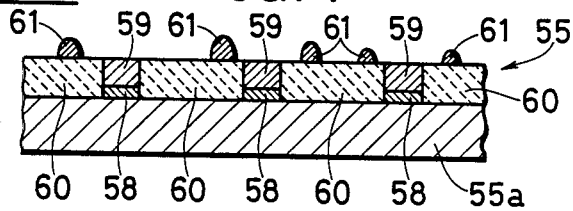
Prior Art FIG.5
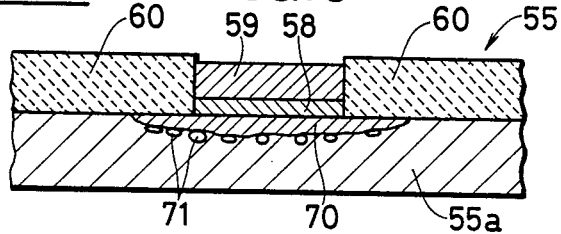

METHOD FOR SELECTIVELY DEPOSITING METAL ON A SUBSTRATE

BACKGROUND OF THE INVENTION

1. Field of the Invention:

This invention relates to a CVD (Chemical Vapour Deposition) method, and more particularly to a CVD method in which a metallic film is formed in a via hole of an insulating film formed on a substrate of a wafer.

2. Description of the Prior Art:

An apparatus which is used for a CVD method of prior art is shown in FIG. 1. Referring to FIG. 1, an inlet 52 and an outlet 53 are made respectively in the side walls of a horizontal reaction chamber 51 which is evacuated. A wafer holding plate 54 is horizontally arranged in the reaction chamber 51. Plural wafers 55 are vertically held at constant pitches by the wafer holding plate 54. An electrical heater 56 is arranged around the reaction chamber 51.

$WF_6$ as gas containing metallic element and $H_2$ as reduction gas are introduced into the reaction chamber 51 from the inlet 52, and they are exhausted outwards from the outlet 53. The electrical heater 56 heats the reaction chamber 51. The temperature of the inner wall of the reaction chamber 51 rises. The heat from the inner wall is transmitted through the reaction gases $WF_6$ and $H_2$ to the wafers 55. The wafers 55 are thus heated, and the reaction gases $WF_6$ and $H_2$ chemically react on the wafers 55. Metallic films are formed on the wafers 55.

FIG. 2 shows the details of the wafer 55. Referring to FIG. 2, an insulating film 60 of $SiO_2$ is formed on a substrate 55a of the wafer 55. Via holes or contact holes 60a are formed in the insulating film 60.

It is inferred that the chemical reaction represented by the following formula (1) is effected in the via holes 60a at the initial stage:

$$WF_6 + 3/2\ Si \rightarrow 3/2\ SiF_4 + W \quad (1)$$

As shown in FIG. 3, a metallic film 58 is rapidly formed on the substrate 55a in the via holes 60a.

Then, it is inferred that the chemical reactions represented by the following formulas (2) and (3) are next effected on the mettalic film surface 58:

$$3H_2 \rightarrow 6H \quad (2)$$

$$WF_6 + 6H \rightarrow 6HF + W \quad (3)$$

These reaction (2) (3) preferrentially occur on the metallic surface.

W films grow with time. Second metallic films 59 are formed on the first metallic films 58 which are formed at the initial stage, as shown in FIG. 4.

Generally, the growing rate G of the W film is expressed by the following equation:

$$G = A[H_2]^{\frac{1}{2}} \exp(-E_a/kT_m) \quad (4)$$

where A represents a positive constant, $[H_2]$ a hydrogen concentration, $E_a$ activation energy, $k$ Boltzmann's constant, and $T_m$ the surface temperature of the growing metallic film.

In the above described CVD method of prior art, the surface temperature $T_m$ of the growing metallic film in the via hole 60a and the surface temperature $T_i$ of the insulating film 60 are nearly equal to each other. As understood from the equation (4), the growing rate G of the W film increases with the surface temperature $T_m$. However, the surface temperature $T_i$ increases with the surface temperature $T_m$, in the prior art CVD method. Accordingly, at high deposition temperature, the metallic films 28 and 29 of W are formed not only in the via hole 60a, but a metallic nucleation 61 are formed also on the insulating film 60, as shown in FIG. 4, since the above chemical reactions represented by the formulas (2) and (3) are effected both in the via hole 60a and on the insulating film 60. That is disadvantageous.

FIG. 5 is an enlarged view of a part of the wafer 55. In the growing process of the metallic film 59, metal W encroaches the interface between the Si substrate 55a and the insulating film 60. Thus, the encroachment 70 is formed. In some cases, voids 71 are formed in the substrate 55a.

These inventors inferred that the turbulent flow or natural convection in the vicinity of the wafer 55 promote the formations of the encroachment 70 and voids 71, in the prior art CVD method. However, control parameters are only two internal parameters, which are pressure and flow rate of reaction gas. Accordingly, it is not possible to control the turbulent flow and natural convection from the outside, and the encroachment and voids cannot be suppressed. The metallic film formation of the prior art has some problems on the reproducibility, controllability and uniformity in the wide range of the pressure and flow rate.

Further in the prior art method, the reaction components are diffused into the whole space of the reaction chamber. They adhere to the inner walls and the observation window. Such problems occur from that fact that dust particles are made, and they are mixed as impurities into the film.

Film formation at low temperature and low concentration is considered for suppressing the encroachment and hollows. However, the growing rate becomes low, such as scores of angstroms Å/min. (Broadbent et al. J. Electrochem. Soc. 131, (42)(1984); Blewer. VMIC (1985)). For example, about two hours are required for filling a contact hole of 1μm depth.

SUMMARY OF THE INVENTION

Accordingly, it is an object of this invention to provide a CVD method in which a metallic film can be formed in a via hole or contact hole of an insulating film on a substrate of a wafer with good quality.

Another object of this invention is to provide a CVD method in which a metallic film can be formed in a via or contact hole of an insulating film on a substrate of a wafer with good selective formation of said metallic film.

A further object of this invention is to provide a CVD method in which a metallic film can be formed only in a via hole or contact hole of an insulating film on a substrate of a wafer at a high rate.

A still further object of this invention is to provide a CVD method in which the encroachment and voids can be suppressed in the formation of the metallic film into a via hole or contact hole of an insulating film on a wafer.

A still further object of this invention is to provide a CVD method in which dust particles are prevented from being made, and so the inner wall of the reaction chamber and the observation window are prevented from contamination.

In accordance with an aspect of this invention, a CVD (Chemical Vapour Deposition) method comprises: (A) the step of holding a wafer on a wafer holder in a reaction chamber to be put under a reduced pressure, at least one via hole being made in an insulating film formed on a substrate of said wafer; (B) the step of introducing a gas containing at least one metallic element into said reaction chamber under the reduced pressure so that a first metallic film of said metal element is formed on said substrate in said via hole of the insulating film of the wafer; and (C) the steps of introducing said gas and a reduction gas into said reaction chamber under the reduced pressure and throwing light of a heating lamp onto said wafer so that some temperature difference is made between said insulating film and said first metallic film, utilizing some differences of absorption ratios of said light among said insulating film, said substrate and said first metallic film, a chemical reaction is effected only on said first metallic film, and a second metallic film of said metal element is formed on said first metallic film.

In accordance with another aspect of this invention, a CVD method comprises: (A) the step of holding a wafer on a wafer holder in a reaction chamber to be put under a reduced pressure, at least one via hole being made in an insulating film formed on a substrate of said wafer; (B) the steps of introducing a gas containing at least one metallic element in flat form substantially parallel to the surface of said wafer into said reaction chamber under the reduced pressure, introducing an inert gas or a second gas containing mainly inert gas towards the surface of said wafer and heating said wafer so that a first metallic film of said metallic element is formed on said substrate in said via hole of the insulating film of the wafer and (C) the steps of introducing said gas and a reduction gas in flat form substantially parallel to the surface of said wafer into said reaction chamber under the reduced pressure, introducing said inert gas or said second gas containing mainly inert gas towards the surface of said wafer and heating said wafer so that a second metallic film of said metallic element is formed on said first metallic film.

The foregoing and other objects, features, and advantages of the present invention will be more readily understood upon consideration of the following detailed description of the preferred embodiments of the invention, taken in conjunction with the accompanying drawings.

BRIEF DESCRIPTION OF THE DRAWINGS

FIG. 1 is a schematic cross-sectional view of a CVD apparatus used for a prior art method;

FIG. 2 is an enlarged cross-sectional view of a part of a wafer arranged in the CVD apparatus of FIG. 1;

FIG. 3 is an enlarged cross-sectional view of the part of the wafer for explaining a metallic film formed in a via hole of an insulating film of the wafer;

FIG. 4 is an enlarged cross-sectional view of the part of the wafer for explaining a second metallic film formed on the first mentioned metallic film;

FIG. 5 is a further enlarged cross-sectional view of a part of the wafer shown in FIG. 4;

DESCRIPTION OF THE PREFERRED EMBODIMENTS

Figure 6:
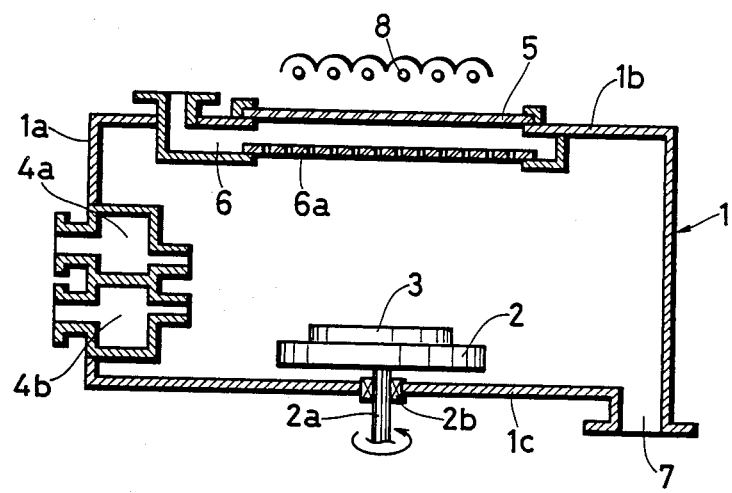
FIG. 6 is a schematic cross-sectional view of a CVD apparatus according to a first embodiment of this invention.

FIG. 6 is a schematic view of a CVD apparatus according to a first embodiment of this invention. Referring to FIG. 6, a wafer holder 2 is rotably arranged in a pressure-reduced reaction or chamber 1. A wafer 3 is held on the wafer holder 2. A shaft 2a is fixed to the wafer holder 2, and it is rotatably and fluid-tightly supported by a bearing 2b which is fixed to a bottom wall 1c of the reaction chamber 1.

Gas introducing portions 4a and 4b having slit-like openings respectively are arranged in one side wall 1a of the reaction chamber 1. $H_2$ as reduction gas is introduced in flat form into the reaction chamber 1 from the one gas introducing portion 4a. $WF_6$ as gas containing metallic element is introduced in flat form into the reaction chamber 1 from the other gas introducing portion 4b. The $H_2$ gas and $WF_6$ gas flow along the surface of the wafer 3.

A transparent quartz glass plate 5 and an inert gas introducing portion 6 are fixed on an upper wall 1b of the reaction chamber 1. A gas-spouting plate 6a of the inert gas introducing portion 6 is made of quartz glass, and transparent. Further, it has numerous small openings, and it is positioned directly under the transparent quartz glass plate 5. Ar gas as inert gas is spouted downwards into the reaction chamber 1 from the gas-spouting plate 6a. The stream direction of Ar gas is substantially perpendicular to the stream direction of the H$_2$ and WF$_6$ gas, so that the H$_2$ and WF$_6$ gas is prevented from diffusing upwards in the course of the stream.

An outlet portion 7 is formed in the bottom wall 1c of the reaction chamber 1. The H$_2$, WF$_6$ and Ar gas is exhausted through the outlet portion 7 outwards from the reaction chamber 1.

An infrared lamp 8 is arranged directly above the transparent quartz glass plate 5 outside of the reaction chamber 1. An infrared ray from the infrared lamp 8 is incident on the surface of the wafer 3 through the transparent quartz glass plate 5 and the gas-spouting plate 6a.

Next, a CVD method using the above described apparatus will be described with reference to FIG. 7 to FIG. 14.

Figure 7:
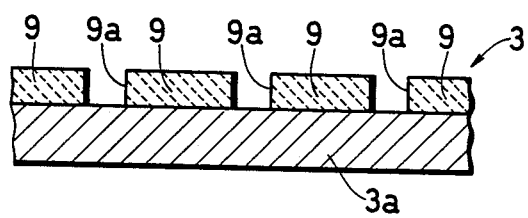
FIG. 7 is an enlarged cross-sectional view of a part of a wafer arranged in the apparatus of FIG. 6.

First, the structure of the wafer 3 will be described with reference to FIG. 7. Referring to FIG. 7, an insulating film 9 of SiO$_2$ is deposited on a substrate 3a of Si (silicon), and via holes 9a are formed in the insulating film 9. The wafer 3 of FIG. 7 is held on the wafer holder 2 in the reaction chamber 1.

H$_2$ gas as reduction gas and WF$_6$ gas as gas containing metallic element are introduced into the pressure-reduced reaction chamber 1 from the gas introducing portions 4a and 4b. The wafer holder 2 is rotated. Ar gas is spouted downwards from the gas-spouting plate 6a.

The infrared ray of the infrared lamp 8 is thrown onto the surface of the wafer 3 through the transparent quartz glass plate 5 and the transparent gas-spouting plate 6a. The wave length range of light components exhibiting the maximum intensity is 1.1 to 3 μm in the infrared ray of the infrared lamp 8.

In the initial stage, it is inferred that the chemical reaction represented by the following formula (5) is effected in the via hole 9a of the wafer 3, in the same manner as the conventional CVD method.

$$WF_6 + 3/2\, Si \rightarrow 3/2\, SiF_4 + W \qquad (5)$$

Figure 8:
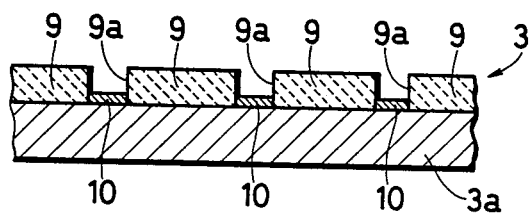
FIG. 8 is an enlarged cross-sectional view of the part of the wafer for explaining a first metallic film formed in a via hole of an insulating film of the wafer.

First metallic films 10 of W are formed on the substrate 3a in the via holes 9a, as shown in FIG. 8. When the first metallic films 10 are formed to a certain depth in the via holes 9a, the above chemical reaction (5) automatically stops. It is known that the depth of the first metallic films 10 is smaller than 1000 Å.

The absorption rate of the substrate 3 of Si is little for the infrared ray components of longer than wave length 1.1 μm. That of the insulating film 9 of SiO$_2$ is little for the infrared ray components of shorter than the wave length 3 μm. However, that of the metallic film 10 of W is known to be larger than those of the substrate 3 of Si and insulating films 9, for the whole range of the infrared ray components of 1.1 to 3 μm. Accordingly the metallic films of W is heated more than the insulating film 9 of SiO$_2$, by the infrared lamp 8. There occurs some temperature difference between the metallic films 10 of W and the insulating film 9 of SiO$_2$.

Therefore, it is inferred that the following chemical reactions represented by the following formulas (6) and (7) are effected only on the surfaces of the metallic films 10 of W:

$$3\, H_2 \rightarrow 6H \qquad (6)$$

$$WF_6 + 6H \rightarrow 6HF + W \qquad (7)$$

Figure 9:
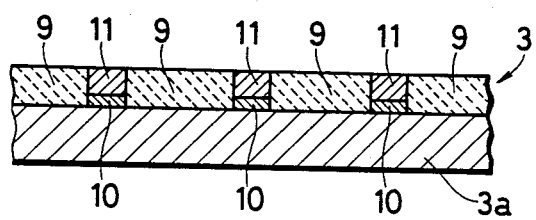
FIG. 9 is an enlarged cross-sectional view of the part of the wafer for explaining a second metallic film formed on the first metallic film.

W films grow with time. As the result, second metallic films 11 of W are formed on the first metallic films 10 of W, as shown in FIG. 9.

Figure 10:
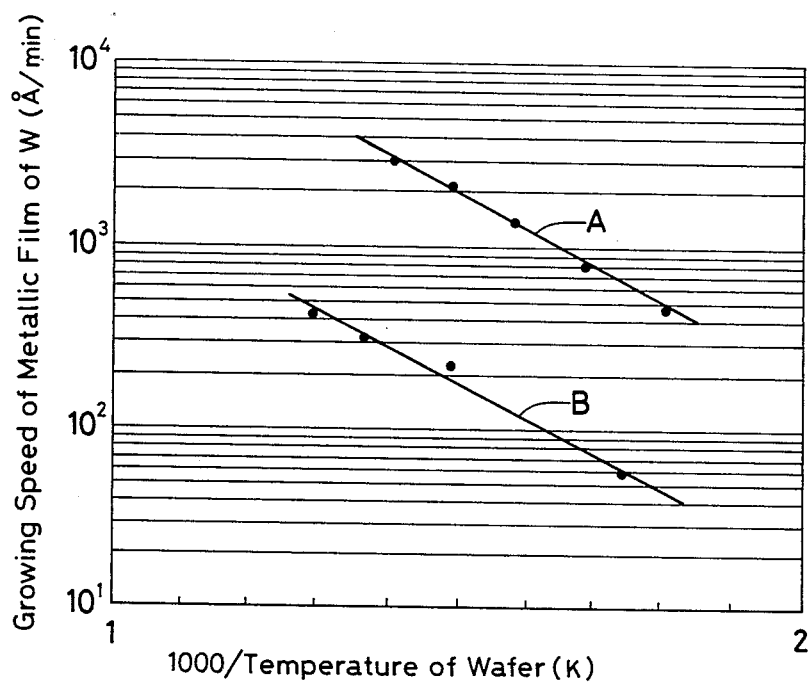
FIG. 10 is a graph for explaining the effects of the first embodiment.

According to this embodiment, the first metallic films 10 of W are deposited on the substrate 3a in the via holes 9a of the insulating film 9, in the initial stage. Then, the above chemical reactions are effected only on the first metallic films 10, since the first metallic films 10 and the insulating film 9 of SiO$_2$ are heated with some temperature difference by the infrared lamps 8. Thus, the metallic films of W are formed only in the via holes 9a of the insulating film 9. As shown in FIG. 10, the growth rate of W film represented by a reference A is further higher in this embodiment than the growth rate of W film represented by a reference B in the prior art method.

Next, there will be described effects of the gas flows in the above embodiment.

Figure 11A:
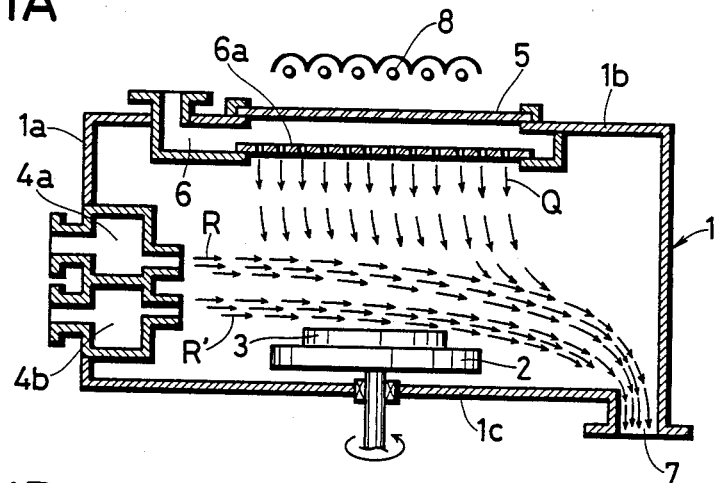
FIG. 11A to FIG. 11C are schematic cross-sectional views of the apparatus for explaining gas flow effects of the first embodiment.
Figure 11B:
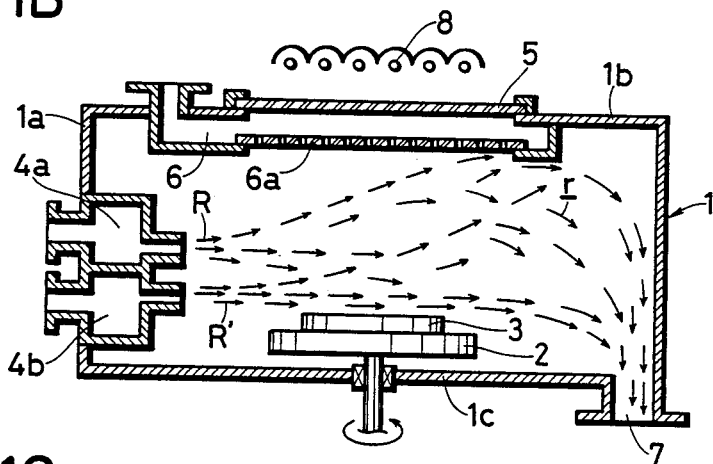
Figure 11C:
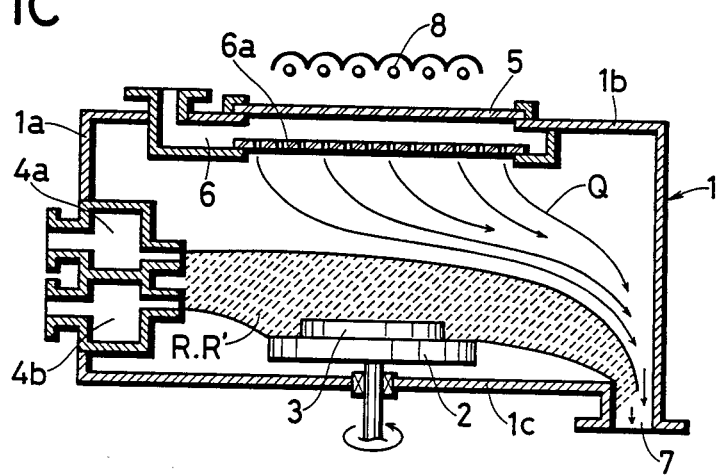

H$_2$ as reduction gas is two-dimensionally jetted into the space S of the reaction chamber 1 from the nozzle opening of the one gas introducing portion 4a and its gas flow is represented by a reference R in FIG. 11A to FIG. 11C, while WF$_6$ as gas containing metallic element is two-dimensionally jetted into the space S of the reaction chamber 1, from the nozzle opening of the other gas introducing portion 4b, and its gas flow is represented by a reference R' in FIG. 11A to FIG. 11C. On the other hand, Ar as inert gas is jetted downwards from the inert gas spouting plate 6a of the inert gas introducing portion 6, and its gas flow is represented by a reference Q in FIG. 11A to FIG. 11C. The flow rates of the gases R, R' and Q can be controlled at the outside. For example, they are so controlled that the flow rate of the inert gas Q is three times as much as the flow rate of the reaction gases R and R'.

As understood from FIG. 11A, the flows of the reaction gases R, R' are limited to the vicinity of the wafer 3, and further they are put into laminar flow condition. It is inferred to cause the above fact that the inert gas flow Q suppresses the reaction gas flows R, R' from the above. Such a stabilizing operation is confirmed by a numerical simulation using computer, and by a visualizing experiment using a titanium tetra-chloride.

The flow of the reaction gases R, R' is macroscopically a localized laminar flow, as shown by the hatch in FIG. 11C. The flow of the inert gas Q decides the range of the localized laminar flow of the reaction gases R, R'. In other words, the shape, extent and range of the hatched portion can be controlled with the flow control of the inert gas Q.

FIG. 11B shows the case that no flow of the inert gas Q is introduced into the reaction chamber 1. As understood from FIG. 11B, the reaction gases R, R'0 diffuse widely, and turbulently flow in the space region r. In that case, the inner wall of the reaction chamber and the observation window is contaminated with the turbulent flow of the reaction gases, as in the prior art method.

However, according to this embodiment, the reaction gas flows R and R' are so stabilized and localized (or bounded) to the vicinity of the wafer 3 as to be shown in FIG. 11A or FIG. 11C. Accordingly, the inner wall of the reaction chamber and the observation window can be prevented from contamination. The quality of the metal films 10 and 11 formed on the wafer 3 can be improved, and the dust particles can be reduced. When the second metal films 11 are formed on the first metal films 10, as shown in FIG. 9, the enchroachment 40 and hollows 41 as shown in FIG. 5 can be prevented from growing under the first metal films 10 or insulating film 9. Accordingly, the yield rate of the semiconductor device using the wafer 3 can be improved.

Since the reaction gases R and R' are made laminar, the method according to this embodiment is superior in controllability and reproducibility. The growth rate distribution of the second metallic film formed on the first metallic film 10 in the wafer 3, and the depth of the encroachment can be controlled with the flow rate of the inert gas Q.

Here, a theoretical ground for the effects of the gas flows according to this embodiment will be discussed.

There are some unclear points on the influence of the reaction gas flows on the encroachment. However, the following inference will be possible:

Because the silicon reduction represented by the above-described formula (5) continues also after the initial stage at which the first metallic film is deposited on the silicon substrate, the remarkable encroachment occurs. The silicon reduction reaction should spontaneously stop at the time when the silicon substrate in the contact hole is covered with the metallic film.

It is considered that the reaction gas is supplied into the wafer 3 through the gaps between the sides of the metallic films 10, 11 and the side walls of the via holes of the insulating film 9, and slight gaps among the numerous crystal grains of the metallic films 10 and 11. In order to promote the silicon reduction on the interface between the metallic film and the silicon substrate, the reaction product ($SiF_4$) should be effectively discharged into the space in the reaction chamber. When a turbulent flow region exists near the surface of the wafer, the reaction product is rapidly discharged and diffused outwards through the above-described gaps due to pumping operation of the turbulent diffusion. However, when the whole surface of the wafer is covered with the laminar flow, the reaction product is discharged outwards only by a molecular diffusion phenomenon. When the gaps are sufficiently narrow, the discharging speed is negligibly small in comparison with the discharging due to the turbulent diffusion. It will be understood from the above that the gas flow control in the vicinity of the surface of the wafer has much influence on the encroachment.

The comparison experiments were made under the same growth temperature, total pressure and partial pressures of the reaction gases in the cases that the reaction gases R and R' are made laminar by the inert gas flow Q and that the reaction gases R and R' are not made laminar. Tungsten hexafloride $WF_6$ and hydrogen $H_2$ as the reaction gases, and argon Ar as inert gas were used as above described.

Tungsten W film was formed to the depth of about 7000 Å in the via hole or contact hole, at the growth temperature of 400° C. under the total pressure of about 0.7 Torr.. According to the observation of the cross-section by scanning electron microscope, the horizontal and vertical lengths of the encroachment were larger than 3200 Å and 2000 Å respectively in the case that the inert gas Q was not used, while they were smaller than 400 Å and 800 Å respectively in the case that the inert gas was used. Further from the film formation experiments under the widely different conditions, it was confirmed that the suppressing effect of the encroachment by the above-described laminarization functions as an independent parameter of the growth temperature and pressure.

In the above embodiment, $H_2$ and $WF_6$ are used respectively for the reduction gas and the gas containing metallic element. However, this invention is not limited to them. For example, $MoF_6$, $TaF_5$, $CrF_4$, $TiF_4$, $TiCl_4$, $MoCl_5$, $WCl_6$, $AlCl_3$ etc may be used for the gas containing metallic element. Further in the above embodiment, $SiO_2$ is used for the insulating film 9. However, this invention is not limited to it. For example, oxide such as $Al_2O_3$, BSG (Borosilicate glass), PSG (Phosphosilicate glass) and BPSG (Borophosphosilicate glass), nitride such as BN and $SiN_x$, or some chemical compound such as $SiN_xO_y$ may be used for the insulating film, where x and y represents numerals, respectively.

Further in the above embodiment, the first and second metallic films are made of W. This invention is not limited to it. For example, the first and second metallic films may be made of a different metal such as Mo, Ta, Cr, Ti and Al, or alloy of two or more of them or alloy of W.

Figure 12:
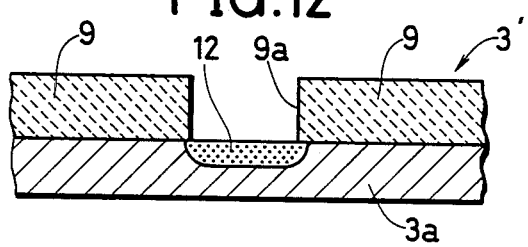
FIG. 12 is an enlarged cross-sectional view of a modification of the wafer used in the apparatus of FIG. 6.
Figure 13:
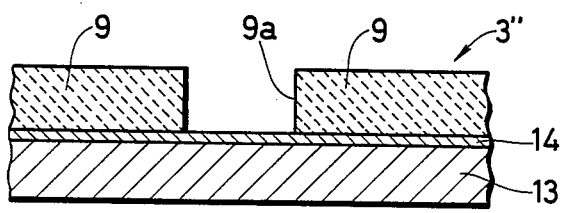
FIG. 13 is an enlarged cross-sectional view of another modification of the wafer used in the apparatus of FIG. 6.

Further in the above embodiment, the substrate 3a of the wafer 3 is made of Si. However, such a wafer 3' as shown in FIG. 12 may be used instead of the wafer 3 that ions 12 of element belonging to the third (III) group or fifth (V) group of the element periodic table are in-planted into a part of the substrate 3a of Si, and that some silicon elements are exposed on the surface in the contact hole 9a. Or such a wafer 3'' as shown in FIG. 13 may be used instead of the wafer 3 that a Si film 14 is formed as the uppermost film on a substrate 13 made of other material or element than silicon. For example, the substrate 13 is made of sapphire.

Further, when the first metallic film of W grows, the silicon elements exposed on the surface of the substrate 3a may be diffused into the metallic film of W. Or also the first metallic film of Mo, Ta, Cr, Ti, or Al, or of alloy of two or more of them or alloy of W grows, the silicon elements exposed on the surface of the substrate 3 a may be diffused into the metallic film of such a metal or alloy.

Further in the above embodiment, the maximum intensity of the infrared lamp 8 is obtained at the wave length of 1.1 to 3 μm. This invention is not limited to that range. an infrared lamp exhibiting the maximum intensity of the ray components at the wavelength of 0.75 to 5 μm may be used.

Figure 14:
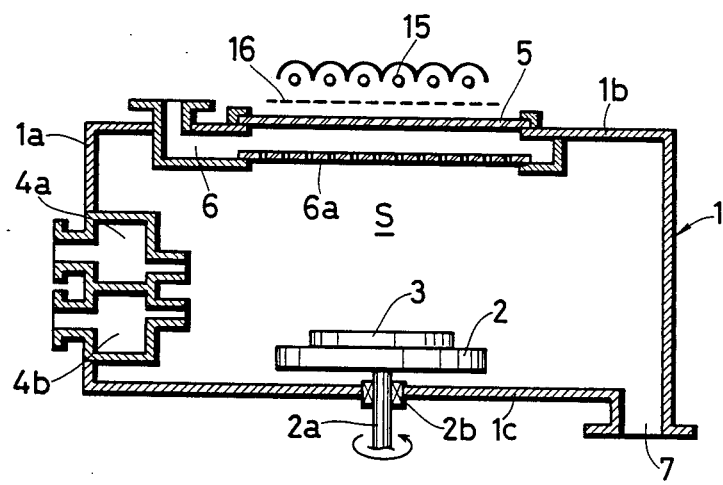
FIG. 14 is a schematic cross-sectional view of a CVD apparatus according to a second embodiment of this invention.

FIG. 14 shows a CVD apparatus according to a second embodiment of this invention. Parts in FIG. 14 which correspond to those in FIG. 6, are denoted by the same reference numerals.

Referring to FIG. 14, a heating lamp 15 is used. An optical filter 16 is interposed between the heating lamp 15 and the transparent quartz glass plate 5. Light components passing through the optical filter 16 from the heating lamp 15 exhibit the maximum intensity at the wave length of 0.75 to 5 μm. The same operation as described in the first embodiment are performed for the wafer 3, and the same effects can be obtained for the wafer 3.

Figure 15:
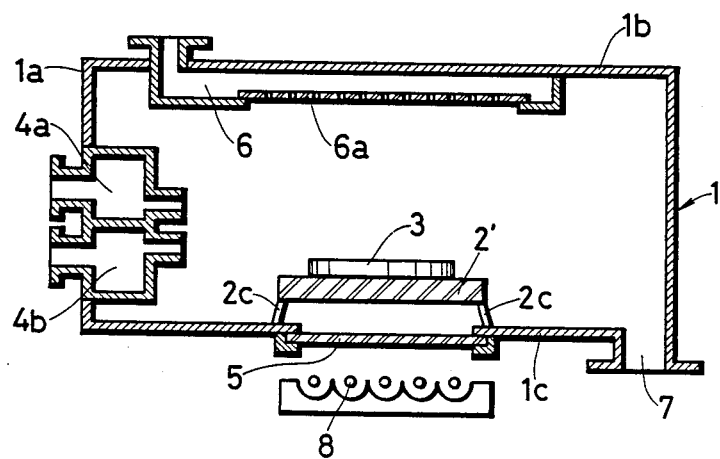
FIG. 15 is a schematic cross-sectional view of a CVD apparatus according to a third embodiment of this invention.

FIG. 15 shows a CVD apparatus according to a third embodiment of this invention. Parts in FIG. 15 which correspond to those in FIG. 6, are denoted by the same reference numerals.

Referring to FIG. 15, the infrared lamp 8 is arranged under a wafer holder 2' which is made of transparent quartz glass. The transparent quartz glass plate 5 is fixed to the bottom wall 1c in contrast to the first embodiment of FIG. 6. The wafer holder 2' is fixed to the bottom wall 1c by support members 2c. The same operations as described in the first embodiment are performed for the wafer 3, and the same effects can be obtained for the wafer 3.

Figure 16:
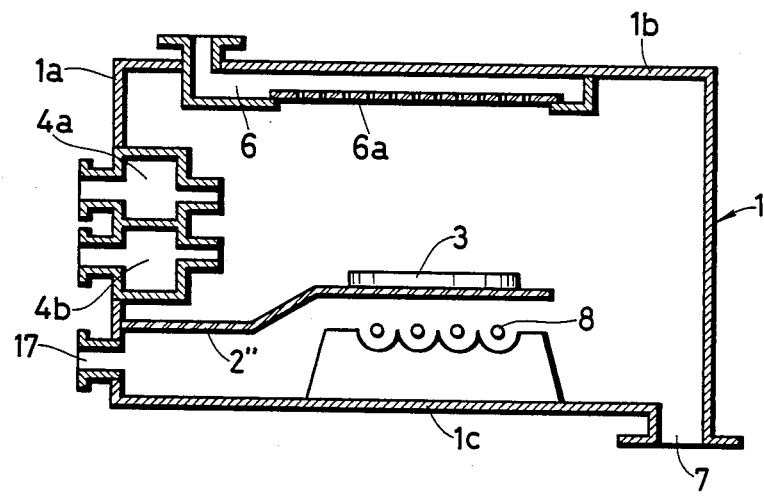
FIG. 16 is a schematic cross-sectional view of a CVD apparatus according to a fourth embodiment of this invention.

FIG. 16 shows a CVD apparatus according to a fourth embodiment of this invention. Parts in FIG. 16 which correspond to those in FIG. 6, are denoted by the same reference numerals.

Referring to FIG. 16, the infrared lamp 8 is arranged under a wafer holder 2" inside of the reaction chamber 1. The wafer holder 2" is made of transparent quartz glass plate, and it is fixed to the side wall 1a of the reaction chamber 1. Further, an inert gas introducing inlet 17 is made in the side wall 1a of the reaction chamber 1. The inert gas from the inlet 17 flows through the space between the wafer holder 2" and the infrared lamp 8, and it is discharged from the outlet 7. The reaction products are prevented from adhering onto the infrared lamp 8 and the wafer holder 2", by the flow of the inert gas from the inlet 17. The same operations as described in the first embodiment are performed for the wafer 3, and the same effects can be obtained for the wafer 3.

Figure 17:
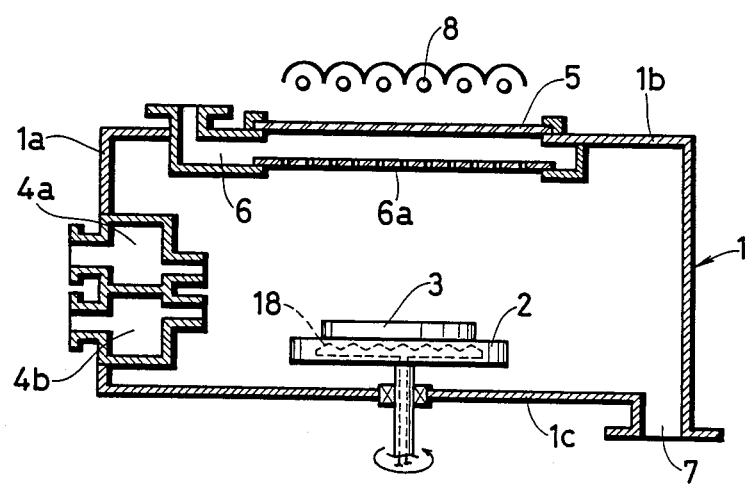
FIG. 17 is a schematic cross-sectional view of a CVD apparatus according to a fifth embodiment of this invention.

FIG. 17 shows a CVD apparatus according to a fifth embodiment of this invention. Parts in FIG. 17 which correspond to those in FIG. 6, are denoted by the same reference numerals.

Referring to FIG. 17, the wafer holder 2 is provided with a heater 18. The wafer 3 is heated also by the heater 18.

The same operations as described in the first embodiment are performed for the wafer 3, and the same effects can be obtained for the wafer 3.

In the above embodiments, the heating lamp or infrared lamp is used. Hereafter, the embodiments without the lamp will be described, also by which a wafer with high quality can be obtained, particularly with respect to the encroachment and voids.

Figure 18:
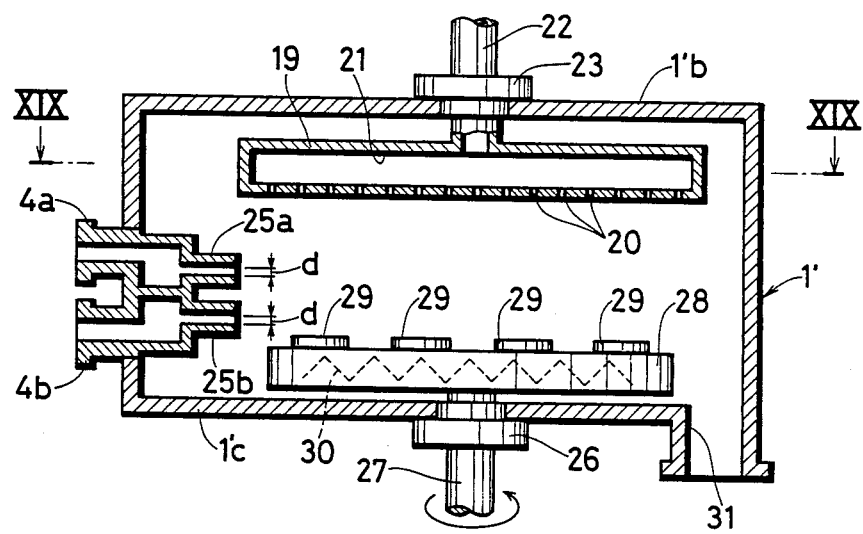
FIG. 18 is a schematic cross-sectional view of a CVD apparatus according to a sixth embodiment of this invention.
Figure 19:
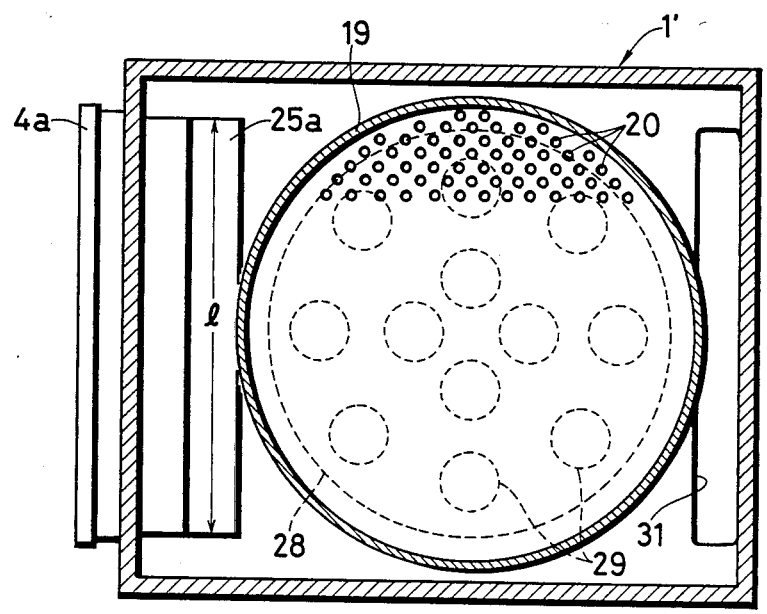
FIG. 19 is a cross-sectional view taken along the line XIX—XIX in FIG. 18.

FIG. 18 and FIG. 19 show a CVD apparatus according to a sixth embodiment of this invention. Parts in FIG. 18 which correspond to those in FIG. 6, are denoted by the same reference numerals. The gas introducing portions 4a and 4b will be described in more detail in this embodiment, although they have the same constructions as in FIG. 6.

The gas introducing portions 4a and 4b have nozzle portions 25 a and 25 b with slit-like openings. Under the levels of the nozzle portions 25a and 25b, a circular wafer holder 28 is rotatably arranged in a reaction chamber 1'. A rotary shaft 27 passing fluid-tightly through a seal member 26 is fixed to the center of the wafer holder 28. The wafer holder 28 is rotated at a predetermined speed. The wafer holder 2 in the first embodiment is similarly rotated. A discharge outlet 31 is formed in the bottom wall 1'c of the reaction chamber 1'.

The wafer holder 28 contains a heater 30. Plural wafers 29 are mounted on the wafer holder 28, and they are heated with the heater 30. The wafers 29 have the same contruction as the wafer 3 described in the first embodiment, as shown in FIG. 7.

An inert gas spouting plate 19 is arranged directly above the wafer holder 28, and it has a hollow portion 21. A pipe 22 passes fluid-tightly through a seal member 23 fixed to the upper wall 1b of the reaction chamber 1', and it communicates with the hollow portion 21. An inert gas such as Ar is supplied into the pipe 22. Numerous small openings 20 are made in the inert gas spouting plate 19, through which the inert gas is spouted downwards.

The nozzle portions 25a and 25b extend substantially in parallel with the upper surface of the wafer holder 28. Also the slit-like openings thereof extend substantially in parallel with the upper surface of the wafer holder 28. The width d of the nozzle portions 25a and 25b is sufficiently small in comparison with the length 1 of the slit-like openings thereof. The reaction gases are spouted from the nozzle openings at the flow rate corresponding to the Reynolds number of larger than 10 (ten). The distance between the level of the nozzle portions 25a and 25b and the surface of the wafer holder 28 is so designed as to be nearly equal to 40% of the distance between the inert gas spouting plate 19 and the upper surface of the wafer holder 28. Although the width d of the nozzle portions 25a and 25b is very small, it is exaggerated in the drawings. The nozzle portions 25a and 25b may be made one common nozzle portion, and the mixing gas of the reaction gases $H_2$ and $WF_6$ may be spouted from the one common nozzle portion. In the operation, the inert gas is spouted downwards from the inert gas spouting plate 19, and the reaction gases are spouted horizontally from the nozzle portions 25a and 25b. The gas flow effect described in the first embodiment, as shown in FIG. 11A to FIG. 11C, can be obtained also in this embodiment. The metallic film is deposited on the substrate with good quality, particularly with respect to the encroachment and void.

Figure 20:
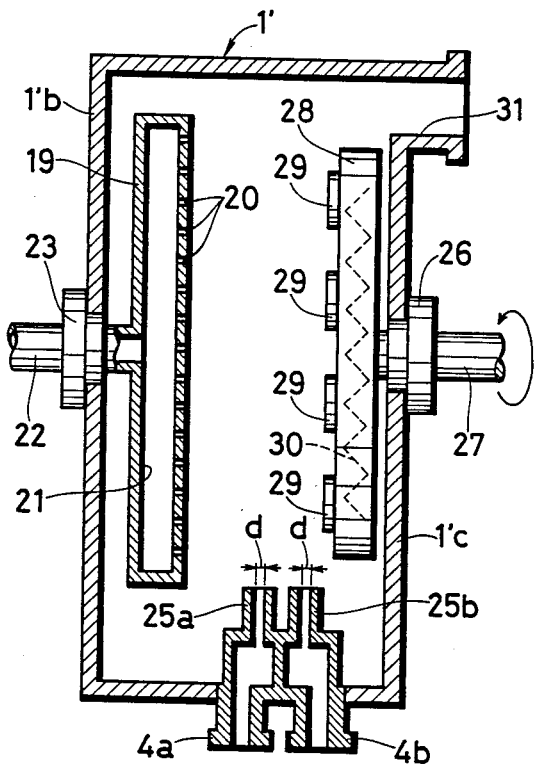
FIG. 20 is a cross-sectional view of a CVD apparatus according to a seventh embodiment of this invention.

FIG. 20 shows a seventh embodiment. Parts in FIG. 20 which correspond to those in FIG. 18, are denoted by the same reference numerals. The whole reaction chamber 1' of this embodiment is angularly displaced by 90 degrees in comparison with that of the seventh embodiment.

While the preferred embodiments have been described, variations thereto will occur to those skilled in the art within the scope of the present inventive concepts which are delineated by the following claims.

Figure 21:
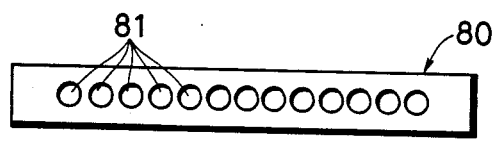
FIG. 21 is a front view of one modification of gas introducing portions in FIG. 6.
Figure 22:
FIG. 22 is a front view of another modification of the gas introducing portions in FIG. 6.

For example, in the above embodiments, the gas introducing portions 4a and 4b have slit-like openings, respectively. Instead, a flat hollow pipe 80 as shown in FIG. 21 may be used. Numerous small openings 81 are made in the front wall. Mixed gas of $WF_6$ and $H_2$ is spouted from the openings 81. Or a flat hollow pipe 90 as shown in FIG. 22 may be used. Two slits 91 and 91 are made in horizontal line, in the front wall.

Further in the above embodiments of FIG. 6 and FIG. 14 to FIG. 17, the plate having numerous small openings is used for the inert gas spouting plate 6a. Instead, a transparent strainer with suitable aspect ratio or a transparent honey-comb may be used.

Further in the above embodiments, inert gas is used as the gas flow towards the surface of the wafer. Instead, an inert gas containing partially reactive gas may be used. In that case, it is necessary that the reactive gas do not make dust particles. For example, the reactive gas may be $H_2$ or $O_2$.

Further in the above embodiments, the gas introducing portions 4a and 4b for $WF_6$ and $H_2$, respectively are arranged. However, they may be united to one, and mixed gas of $WF_6$ and $H_2$ may be introduced from one gas introducing portion.

Further in the embodiment of FIG. 17, the wafer holder 2 contains the heater 18. Instead, it may contain an infrared lamp. In that case, the infrared lamp 8 outside of the reaction chamber 1 may be omitted, and the holder 2 should be transparent.

What is claimed is:

1. A method for selectively depositing metal on a surface of a substrate comprising the steps of:
   (A) holding a wafer on a wafer holder in a reaction chamber under a reduced pressure, at least one via or contact hole being made in an insulating film formed on a surface of a substrate of the wafer;
   (B) introducing a gas containing at least one metallic element into said reaction chamber under the reduced pressure so that a first metallic film of said metallic element is formed on said surface of said substrate in said via or contact hole of the insulating film; and
   (C) introducing said gas and a reduction gas into said reaction chamber under the reduced pressure and directing light of a heating lamp onto said wafer such that some temperature difference is made between the temperature of said insulating film and the temperature of said first metallic film, the temperature difference resulting from the difference of absorption ratios of infrared components of said light among said insulating film, said surface of said substrate and said first metallic film, whereby a chemical reaction is effected only on said first metallic film and a second metallic film of said metallic element is formed only on said first metallic film.

2. A method for selectively depositing metal on a surface of a substrate according to claim 1, in which said reduction gas is $H_2$, and said gas containing said metallic element as a constituent includes one or more of $WF_6$, $MoF_6$, $TaF_5$, $CrF_4$, $TiF_4$, $TiCl_{14}$, $WCl_6$, and $AlCl_3$.

3. A method for selectively depositing metal on a surface of a substrate according to claim 1 in which said insulating film is one or more of $SiO_2$, $Al_2O_3$, BSG, PSG, BPSG (oxides), BN, $SiN_x$ (nitrides) and $SIN_xO_y$ ( x, y represent numerals).

4. A method for selectively depositing metal on a surface of a substrate according to claim 1, in which said second metallic film is one or more of WMo, Ta, Cr, Ti, Al, and alloys consisting of two or more of WMo, Ta, Cr, Ti, and Al.

5. A method for selectively depositing metal on a surface of a substrate according to claim 1 in which a silicon film is formed as an uppermost layer in said substrate of the wafer.

6. A method for selectively depositing metal on a surface of a substrate according to claim 1 in which said heating lamp is an infrared lamp.

7. A method for selectively depositing metal on a surface of a substrate according to claim 1 in which optical filter means is interposed between said heating lamp and said wafer so that light components of wave length 0.75 to 5 μm are most intensive in the light thrown onto said wafer.

8. A method for selectively depositing metal on a surface of a substrate according to any of claims 2, 3, 4, 5, 6 or 7, further comprising the step of spouting an inert gas or a gas containing mainly inert gas towards said wafer such that said gas containing at least one metallic element and said reduction gas are introduced from gas introducing portions, the extending directions of which are substantially parallel to the surface of the wafer, in flat form substantially parallel to the surface of the wafer.

9. A method for selectively depositing metal on a surface of a substrate according to claim 1 in which said wafer holder is rotated.

10. A method for selectively depositing metal on a surface of a substrate according to claim 1 in which said wafer holder is transparent, and the light of said heating lamp is thrown through said wafer holder onto said wafer.

11. A method for selectively depositing metal on surface of a substrate according to claim 10, in which an inert gas is flown between said heating lamp and said wafer holder.

12. A method for selectively depositing metal on a surface of a substrate, comprising the steps of:
   (A) holding a wafer on a wafer holder in a reaction chamber to be put under a reduced pressure, at least one via or contact hole being made in an insulating film formed on a surface of a substrate of said wafer;
   (B) introducing a gas containing at least one metallic element from a gas introducing portion, the extending direction of the gas introducing portion being substantially parallel to the surface of the wafer, in flat form substantially parallel to the surface of said wafer into said reaction chamber under reduced pressure, introducing an inert gas or a second gas containing mainly inert gas towards the surface of said wafer and heating the wafer so that a first metallic film of said metallic element is formed on said surface of said substrate in said via or contact hole of the insulating film; and
   (C) introducing said gas and a reduction gas from the gas introducing portions in flat form substantially parallel to the surface of said wafer into said reaction chamber under the reduced pressure, introducing said inert gas or said second gas containing mainly inert gas towards the surface of said wafer, and heating said wafer so that a second metallic film of said metallic element is formed on said first metallic film.

13. A method for selectively depositing metal on a surface of a substrate according to any of claim 12 to 14, in which said reduction gas is $H_2$ and said gas containing at least one metallic element as a constituent includes one or more of $WF_6$, $MoF_6$, $TaF_5$, $CrF_4$, $TiF_4$, $TiCl_4$, $WCl_6$ and $AlCl_3$.

14. A method for selectively depositing metal on a surface of a substrate according to claim 12 in which said insulating film is one or more of $siO_2$, Bsg, Psg BPSG (oxides), BN. $SiN_x$ (nitrides) and $SiN_xO_y$ (x, y represent numerals).

15. A method for selectively depositing metal on a surface of a substrate according to claim 12, in which said second metallic film is one or more of W, Mo, Ta, Cr, Ti, Al, and alloys consisting of two or more of W, Mo. Ta, Cr, Ti, and Al.

16. A method for selectively depositing metal on a surface of a substrate according to claim 12 in which said substrate of the wafer is mode of silicon (Si), and at least some silicon elements are exposed in said via or contact hole.

17. A method for selectively depositing metal on a surface of a substrate according to claim 12 in which silicon film is formed as an uppermost layer in said substrate of the wafer.

18. A method for selectively depositing metal on a surface wafer holder is rotated.

19. A method for selectively depositing metal on a surface of substrate according to claim 6, wherein the light from said infrared lamp having wavelengths between 0.75 and 5 μm is most intensive.

20. A method for selectively depositing metal on a surface of a substrate according to claim 1, wherein said substrate of the wafer is made of silicon (Si) such that a portion of the silicon is exposed in each of said via hole.

* * * * *